United States Patent
Luk

(10) Patent No.: US 7,266,741 B2
(45) Date of Patent: Sep. 4, 2007

(54) GENERATION OF TEST VECTORS FOR TESTING ELECTRONIC CIRCUITS TAKING INTO ACCOUNT OF DEFECT PROBABILITY

(76) Inventor: Fong Luk, 216 Sweet Rd., Alameda, CA (US) 94502

( * ) Notice: Subject to any disclaimer, the term of this patent is extended or adjusted under 35 U.S.C. 154(b) by 271 days.

(21) Appl. No.: 10/992,922

(22) Filed: Nov. 19, 2004

(65) Prior Publication Data

US 2006/0123288 A1  Jun. 8, 2006

(51) Int. Cl.
*G01R 31/28* (2006.01)

(52) U.S. Cl. .................. 714/724; 714/738

(58) Field of Classification Search ............ 714/724, 714/738, 739, 741
See application file for complete search history.

(56) References Cited

U.S. PATENT DOCUMENTS

| | | | | |
|---|---|---|---|---|
| 5,414,716 A | * | 5/1995 | Bershteyn | 714/738 |
| 6,567,946 B1 | * | 5/2003 | Nozuyama | 714/741 |
| 6,728,910 B1 | * | 4/2004 | Huang | 714/711 |
| 6,920,621 B1 | * | 7/2005 | Toutounchi et al. | 716/4 |
| 2005/0240887 A1 | * | 10/2005 | Rajski et al. | 716/4 |

* cited by examiner

*Primary Examiner*—James C Kerveros
(74) *Attorney, Agent, or Firm*—Bo-In Lin

(57) ABSTRACT

A method for generating test pattern signals weighted by the fault probability to greatly simplify the test process and to reduce the number of test vectors required for conducting the integrated circuit functionality tests. The method takes into consideration that the electrical short conditions occur mostly between adjacent nodes. The "fault coverage" concept is revised to test faults occurred between adjacent nodes and the test vectors are generated based a fault-probability weighted algorithm such that tests are conducted mostly on connections between adjacent nodes either on a same horizontal layer of between vertical nodes having vertical overlapping areas.

13 Claims, 2 Drawing Sheets

GENERATION OF TEST VECTORS FOR TESTING ELECTRONIC CIRCUITS TAKING INTO ACCOUNT OF DEFECT PROBABILITY

BACKGROUND OF THE INVENTION

1. Field of the Invention

This invention relates generally to the method and system of testing the electronic circuits including the integrated circuits (ICs). More particularly, this invention relates to an improved system configuration and method for simplifying and expediting the testing processes for electronic circuits including integrated circuits (ICs) by applying an improved algorithm by taking into account the defect probability as a key factor for generating the testing vector.

2. Description of the Prior Art

As the integrated circuits (ICs) and other form of electronic circuits become more complicate with higher level of integration and increasingly faster operational speed, the traditional techniques of the circuit testing configurations and methods are challenged by many technical difficulties. One of the major difficulties is the concept of "fault-coverage" in an attempt to more thoroughly and completely test the electronic circuits supported on either a semiconductor wafer or on other circuit support platforms applying various fabrication processes. Since the integrated circuit (IC) chip(s) is generally the most critical and expensive part of an electronic system, it is highly desirable to more thoroughly test the IC chip(s) to assure that functionalities as designed onto each IC chip can function properly. In order to achieve this goal, a high percentage of fault coverage is desirable. However, as the IC chips and electronic device becomes miniaturized to include large number of different transistors and accompanied circuits, high percentage fault coverage becomes an extreme heavy burden on the manufacturing and testing of the IC chips. As will be discussed further below, an IC chip designer is now required to design into the IC chips testing circuits for relieving this heavy burdens placed on testers of the IC chips to allow for more conveniently achieving a higher percentages of fault coverage in the testing processes and this is called DFT.

The development of the fault coverage concept in testing the electrical circuits started in an era before the IC fabrication and other similar techniques were developed. Prior to integrated circuit (IC) and other similar fabrication technologies, manual point-to-point crossed wiring with insulated copper wire and manual cabling are major tasks of the electric and electronic system manufacturing processing. In this type of process, the probability of any node being shorted or mis-wired to any other node is unpredictable or at the least very hard to characterize. However in that time, all the system complexity is very low in terms of test equipment capability. A one hundred percents (100%) fault coverage can be easily achieved. There are no practical needs to spend effort in reducing test vectors. However, in the meantime, the theory of fault coverage is formulated and firmly planted in the mind of the testing industries as an important index of merit in carrying out circuit tests.

Due to the rapid development of very large-scale integrated circuit (VLSI) and system on chip (S.O.C) technology, the extreme circuit complexity of state of art VLSI and S.O.C. has made testability becoming a major issue in the production process. The conventional pattern generation algorithm guided by fault coverage theory has come to a point that an astronomical number of test patterns are required to produce sufficient test coverage and that leads to the use of complex device to carry out very costly tests. In increasing numbers of cases, the test requirement becomes too complicate and not practical or economically not viable even by using those most advance test equipments.

One specific example is U.S. Pat. No. 6,385,750 issued to Kapur et al. They disclose a method and system for increase the fault coverage of test vectors for testing integrated circuits. The Kapur et al. provide a method and system for reducing the number of deterministic test vectors required for testing integrated circuits by inserting test points. A fault list having all the potential faults of an integrated circuit design is initialized and all the potential faults are marked as untestable. A set of test patterns, T, for testing several of the potential faults is generated. A fault simulation process is then performed on the integrated circuit design with the test patterns, T, to mark off untested faults. During fault simulation, fault propagation is monitored to determine the nets in the design to which faults were propagated. The nets at which fault propagation discontinues (e.g., de-sensitized) are also monitored. This information is collected over the set of test patterns, T. Based on the fault propagation information; test points are selectively inserted to maximize the fault coverage of the set of test patterns, T. In one embodiment, Kapur et al. also select nets to which most untested faults propagate for test point insertion and applying user-defined parameter to determine the selected number of test points. These steps are then repeated for another set of set patterns until the desired fault coverage is achieved. By adding test points, Kapur et al. intend to improve the fault coverage of the test patterns to reduce the test data volume. However, even with the benefits of reduced volume of testing data, as more testing points are added for the purpose of reducing the volume of test data, additional costs and time are required for carrying out the tests to include those inserted testing points.

To overcome this manufacturing bottle neck, a variety of testing techniques have been adapted such as BIST which needs additional circuitry to be incorporated into the device during early design stage thus costing not only silicon real state and design engineering time but also affecting device performance and capacity. Some other techniques such as IDDQ can only provide limited improvement but are not effective enough to remedy the problem significantly. All prior art have fault coverage as the goal and measurement of effectiveness, but in current production environment, different sets of test pattern with same fault coverage may have different numbers of malfunction device undetected in the same lot of devices.

Therefore, there is still a demand in the art of IC testing for a new technique and system configuration which can simplify the IC testing processes thus significantly reducing the requirements for expensive testing equipments, the long-hours of engineers' efforts for testing pattern generating and output signal simulation, the memory required for the storage of the testing input and output data, and the highly sophisticated control of exact timing in transmitting and collecting of these data.

SUMMARY OF THE PRESENT INVENTION

It is therefore an object of the present invention to provide a new IC testing technique and system configuration to overcome the aforementioned difficulties encountered in the prior art.

Specifically, it is an object of the present invention to provide a new IC testing technique for generating testing pattern signals weighted by the fault probability to greatly simplify and reduce the number of testing vectors required for conducting the IC functionality tests.

Another object of the present invention is to provide a new IC testing technique by taking into consideration that the electrical short conditions occur mostly between adjacent nodes. The "fault coverage" concept is revised to test faults occurred between adjacent nodes and the test vectors are generated based a fault-probability weighted algorithm.

In a preferred embodiment, this invention discloses a method for generating a set of test patterns for testing an electronic circuit having a plurality of circuit nodes. The method includes a step of generating the set of test patterns by applying a weighting factor based on a defect probability a circuit connection between two of the plurality of circuit nodes.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
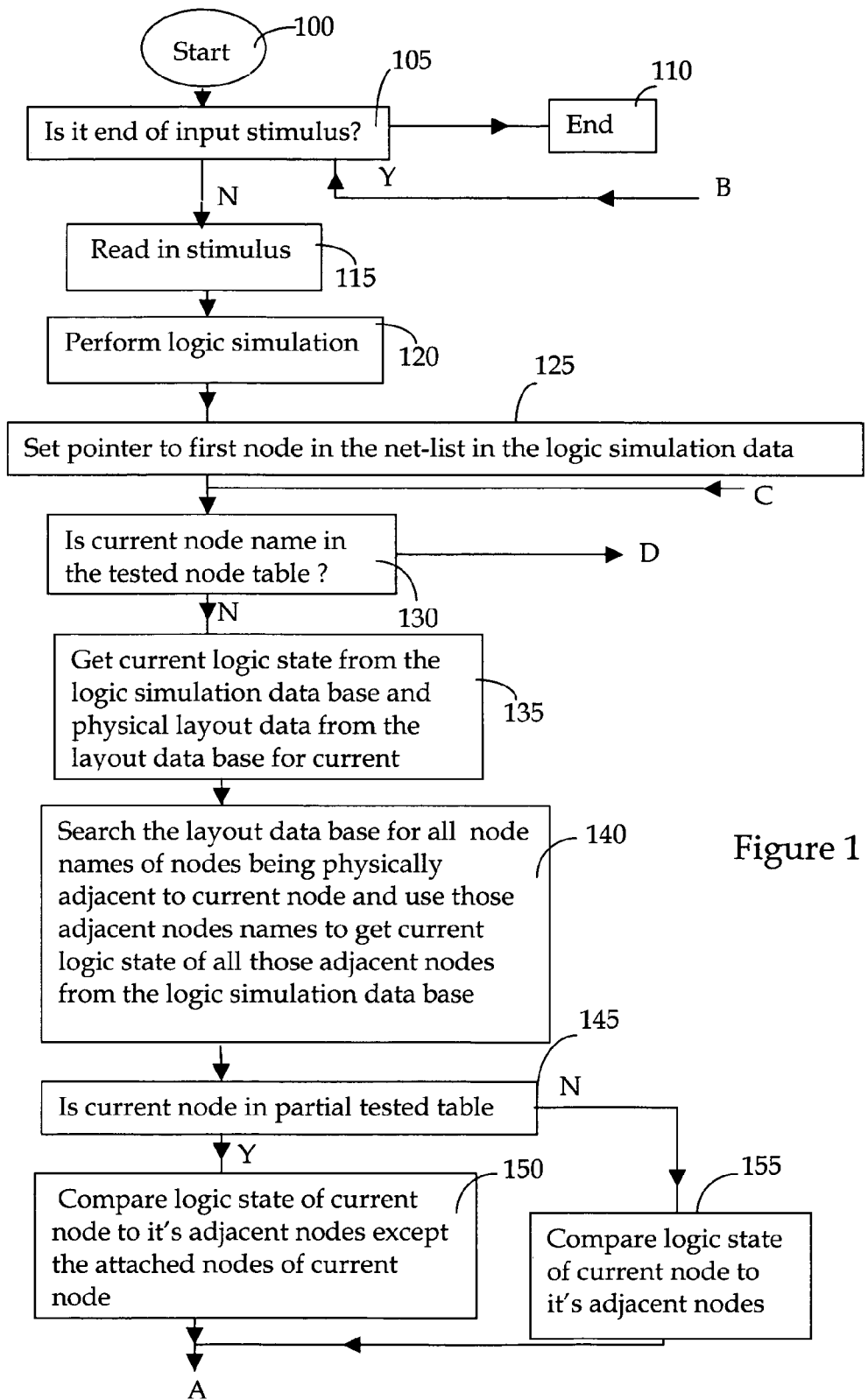
FIG. 1 is a flowchart for showing the processing steps carried out by a test system of this invention to provide simplified, effective tests for electronic devices taking into consideration of defect probability.
Figure 1:
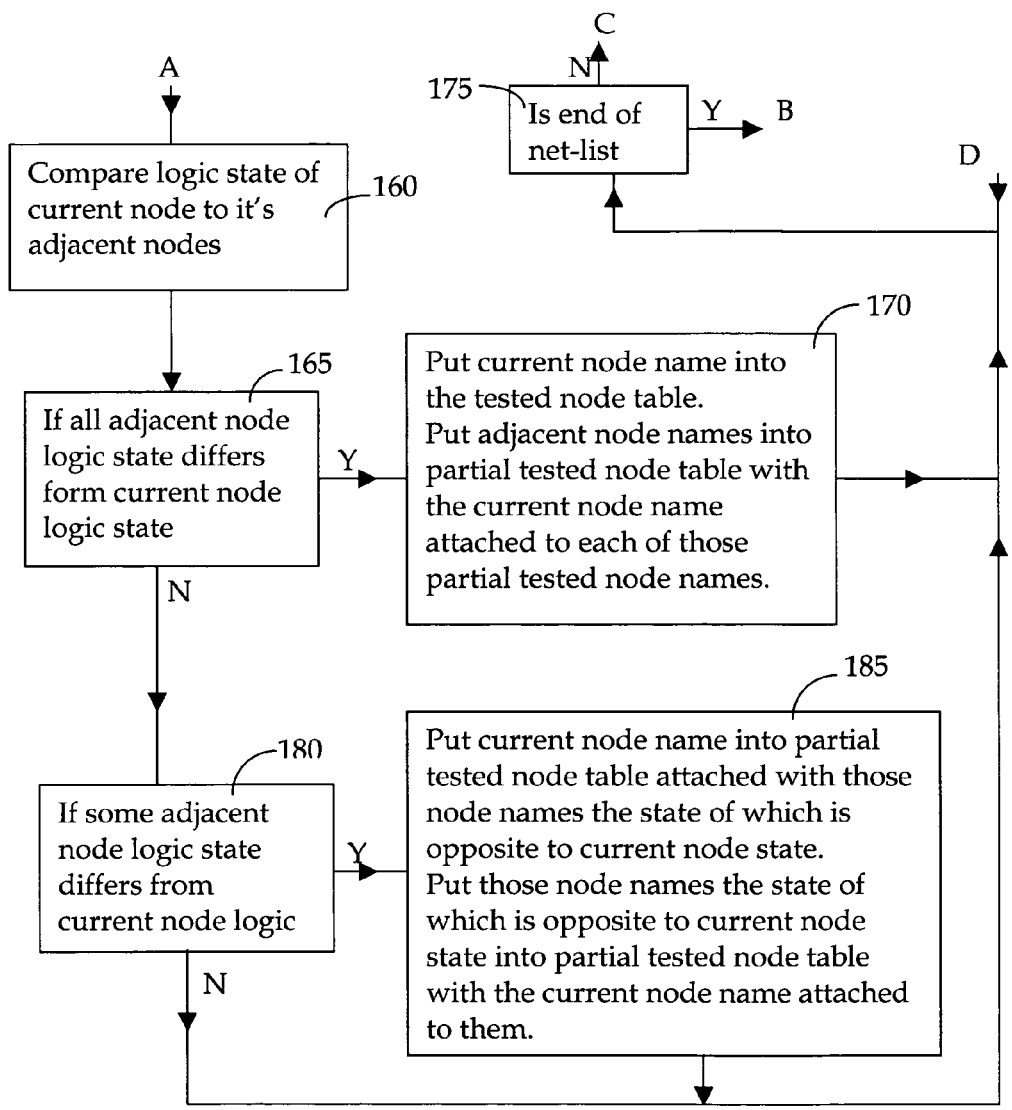

The present novel invention is different and totally non-obvious when compared to the conventional wisdom of fault coverage theory. Instead of focusing on detection of all faults or maximum number of faults, it takes into the account of the characteristics of modern day technologies of manufacturing processes for the printed circuit board and integrated circuit. A new approach is implemented to detect potential defects of circuits or circuit connectivity by taking into account the defect probability and defect density. Typically there are three types of failures that commonly cause circuit faults. The first two types, the internal circuit continuity, i.e., broken traces, within a node and excessive leakage between nodes are much less of a problem for testing. An internal circuit continuity test can be simply carried out by driving the respective nodes to two different states, i.e., 1 and 0's in binary logic system, and measuring output for correct responses. Simply driving the respective nodes to different states and measuring the supply current can detect the excessive leakage between nodes. In actual practice, measuring the ICC or IDD while exercising all circuit functions is often performed to detect excessive current.

The major problem is in the testing of the third type fault, i.e., the short between nodes. In order to detect shorts between every two nodes, the required test patterns would be astronomical under the assumption that the probabilities of a short between any nodes are equal. While all of the prior art test technologies are generating test patterns to achieve maximum fault coverage under this assumption, this assumption has long been outdated when applied to the configurations of connections between different nodes for the modern IC and circuits fabricated by other techniques.

The essence of this invention is to take into account that the probability of short between any two nodes depends on their respective physical locations and type of process and technology. For most cases, the highest probability of short is between adjacent nodes, i.e., nodes physically located adjacent to each other. The circumstances where short occurs for a connection between a node to other nodes without shorting to adjacent node would be almost impossible. In most electronic circuits including the integrated circuits (IC) connections are constructed by stack of layers of circuitry separated by insulation material and connected by feed through holes. In this case, adjacent nodes would be nodes with conducting traces or areas next to each other horizontally on the same layer and/or having vertical overlap area between respective adjacent layers. Short over adjacent node in those cases have to be either shorten through more than one layer without shortening to the middle layer or shorten across more than one trace without shortening to the middle trace in between. Since in today's process, shorts through layer will be high unlikely and will almost always accompany with shorts between adjacent traces in the same layer, it will be practical to concentrate the test effort in testing shorts between adjacent traces in each layer. Of course in other hand if extremely low defect-miss requirement is necessary, an adjacent node category can include a test between layers and include nodes separated by one or more traces or layers. Even with the expanded category of adjacent nodes under such low defect-miss requirement, compared to the prior art technologies, the test vectors will still be significantly less.

Once the adjacent node category is defined, the internal circuit continuity test which has test pattern exercising all nods is to be run and at the same time, all traces having its adjacent nodes being at least once in the opposite states is to be marked out as fully test nodes. The following step is to generate test vectors to make those unmark adjacent nodes to be in different stats at least once.

To achieve above operation in actual practice, the first step is to merge the CAD circuit layout data base with the logic simulation database such that each layout trace on each layer can be identified by the corresponding physical CAD layout dimension and CAD layout coordinate, simulation node name and simulation logic level at each basic simulation timing slot. There are many ways to merge these two databases. One of the ways is to attach each node name in the net-list for the logic simulation database with the physical dimension and coordination data from the layout database. The second step is to run the internal circuit continuity test vector, which is normally the functional test generated by design engineer to check out the logic function of the chip and some times it can be a self-diagnostic program of the chip, through the system logic simulator and at each system clock cycle, scan through each circuit layer to mark out all traces with it's adjacent node being in a different state. When the test finished, those nodes with all the adjacent nodes having at least once been in a different state are registered as tested nodes and marked out differently, e.g., setting up a data file table with all the net-list nodes by naming the nodes as tested nodes. Also, all the partially tested nodes which have part of it's adjacent nodes being at least once in a different state are marked as partially tested nodes. There are varieties of different ways to accomplish the marking out those tested nodes and partial tested nodes. One of which is to setup a table for storing the tested node names and another table for storing the partial tested node names along with node names of the logic states of which have been differ from the partial tested node. The third step is to generate test vectors to make nodes of those untested and partially tested nodes in a different state and check for correct output responses. These test vectors can be generated by back tracking through the logic simulation or by means of self-diagnostic program or randomly generated input stimulus or by other means. The last step is to merge common parts of those newly generated test vectors sets to minimize the number of test vector. Namely, the first and second steps described above are recognized in this invention as defect simulation to distinguish from the conventional fault simulation. The defect simulation as disclosed here can be used to replace the conventional fault simulation in many applications such as in ATPG (automatic test pattern generation) to produce drastic improvement of results, e.g., to drastically reduce the test patterns in case of ATPG application.

FIG. 1 is a flowchart showing the steps for carrying out a simplified and effective process of this invention in application of defect simulation. The test process starts (step 100) by checking if it is the end of stimulus (step 105) and end the test process if it is the end of the stimulus (step 110). The test processes continues with reading in the next stimulus (step 115) and carry out a logic simulation using the stimulus received (step 120). After the logic simulation is completed, the test process continues by setting pointer to the first node in the net-list in the logic simulation database (step 125). A check is carried out by checking if the current node is marked out in the tested node table, if it is, then a check is carried out to determine if the current node is the end of the net list (step 175). If the current node is not marked out in the tested node table, the process continues by getting the current logic state from the logic simulation database and also the layout data from the layout database for current node (step 135). Then a search is carried out in the layout database for all the nodes, each with a node name, physically adjacent to the current node. The node names of these adjacent nodes are used to obtain the logic state of these adjacent nodes from the logic simulation database (step 140). Then it is checked if the current node is in the partial tested table (step 145) and the logic state of the current node is compared with that of the adjacent nodes if the current node is not in the partially tested table (step 155). The logic state of the current node is compared to the adjacent nodes except the attached nodes of the current node if the current node is listed on the partially tested table (step 150). After comparing the logic state of the current node with the adjacent nodes (step 160), a comparison is made to determine if the logic state of the current node is different from the logic state of all the adjacent nodes. When all adjacent node logic state differs from current node logic state, then the name of the current node is placed into the tested node table. The name of the adjacent nodes are placed into the partially tested table with the name of the current node attached to each of those partially tested node names (step 170) followed by a check to determine if the current node is the end of the net-list. Under the condition that all adjacent node logic state is not different from the current node logic state, then the test process is followed by a check to determine if some adjacent node logic state differs from the current node logic state (step 180), if it is, then current node name is placed into the partially tested table attached with those node names with the state opposite to current node logic state. The node names with the state opposite to current node logic state is placed into the partially tested table with the current node name attached to these partially tested adjacent nodes (step 185). The process is followed by a check to determine if the current node is the end of net-list (step 175) followed by a check to determine if there is further stimulus as input to continue the test process (step 105) and end the process when there is no more stimulus to proceed with the test process (step 110).

According to above descriptions, this invention discloses a method for generating a set of test patterns for testing an electronic circuit having a plurality of circuit nodes. The method includes a step of generating the set of test patterns by applying a weighting factor based on a defect probability of a circuit connection between two of said plurality of circuit nodes. In a preferred embodiment, the step of generating the set of test patterns further comprising a step of applying a weighting factor based on a defect probability of a circuit connection between two of said plurality of nodes physically adjacent to each other.

According to above descriptions, this invention also discloses a method for the construction of a process, i.e., a defect simulation, to measure the realistic manufacture process with related test coverage based on a defect probability of a circuit connection between two of said plurality of circuit nodes for the actual manufacturing process being used.

Another application of the invention to generate test pattern is that the design engineering is to formulate a functional test input stimulus (some times it is assembled or compiled from a self test diagnostic program) and identify each storage bits with corresponding schematic node names in logic simulation directly used for layout and we will get the physical layout information for these node names from layout data base and using it to modify and expend the functional test to make all physical adjacent nodes of each storage bits in different logic state at least once.

One issue to need to address to some of the above methods and applications is the effect of the shorts between nodes may not be detected from output for until many cycles later (especially for circuits without DFT) thus prolongs testing time which costs money. The solution is that using the detection of short circuit current caused by the short circuit. By monitoring of the current supply to the circuit during the circuit operation, short circuit between nodes can be detected by detecting the current increase of the current supply due to the short circuit current caused by shorts between circuit nodes, which are in different logic states. Voltage supply can be divided into multiple supply nets with current increase detection circuits and voltage regulation circuits, so the short circuit current can be easily detected and the location of the defect can be easily located.

Another application of the invention to generate test pattern is to have the design engineering to formulate a functional test input stimulus (some times it is assembled or compiled from a self test diagnostic program or strings of scan pattern) and identify each subgroup of test input stimulus and it's operand with corresponding node name from the layout data base or the corresponding circuit data base, which needs large amount of repetitive test. (For example: in case of reading and writing all register with different of values in a variety of sequence to test cross talk between bits, the design engineer needs to identify the input stimulus bit position corresponding to the operand field of each reading or writing instruction and provide the corresponding node name for the storage bit being read and written.) We will then get the physical layout information for these node names from layout database and using it to modify and expend the subgroup of the functional test to make all physical adjacent nodes of each storage bits in different logic state at least once. Above procedure can also apply to subgroup of test input stimulus, which needs many test in different sequence such as testing CPU instructions "read, write, or, and, xor, etc." in different sequence.

For example:
1. The design engineer formulate the subgroup of test vector for writing 0 into register A, B and C of 2 bits each.
In assembly language form:
WRITE A, 0
WRITE B, 0
WRITE C, 0
In input stimulus form:
10100 00
10101 00
10110 00

The bit 1 is clock pin, bit 2-3 is coded for write instruction, bit 4-5 is the register address field and bit 6-7 is the 2 bit operand field for writing value into the register.

2. The design engineer will identify bit 6-7 is the operand field, which needs changing many value to create new input stimulus. For easy discussion, we put the Input stimulus in following form:
10100 S1S2
10101 S3S4
10110 S5S6

Here the S1, S2, S3, S4, S5 and S6 are the bits to be written into register A, B and C.

3. The data from layout database to create following adjacent node list:
S1-S3, S4 This means S1 has adjacent bits of S3 and S4
S2-S1, S3, S5
S3-S1, S2, S6
S4-S1, S3
S5-S2, S6
S6-S3, S4, S5

4. Set up one or more set of input stimulus to make above bits in different logical states at least once, using above adjacent node list and going down the list line by line as following:

$1^{st}$. line: As S1 is set to 1, S3 and S4 must be 0 to have S1 be fully tested.

$2^{nd}$. line: Since S3 is 0, S2 must be 1 and S5 must be 0 but S1 is already been set to 1, so S2 is needed to be test against S1 in the next test vector. S2 is partially tested.

$3^{rd}$. line: Since S3 is 0, S6 must be 1 (S1 and S2 are already 1) to have S3 be fully tested $4^{th}$. line: Since S1 is 1, S4 must be 0 but S3 is already needed to be set to 0 so S4 is needed to be test against S3 in the next test vector. S4 is only partially tested $5^{th}$. line: Since S5 is already set to 0 and S2 and S6 are already set to 1, S5 is fully tested.

$6^{th}$. line: Since S6 is already set to 1 and S3 S6 S5 are already set to 0, S6 is fully tested.

The first set of input stimulus will be as following:
10100 11
10101 00
10110 01

To generate the next test vector, first eliminate all bits being fully tested lines and repeat above steps again. In this case only the $2^{nd}$ and $4^{th}$ line left partially tested so just invert the state of S2 and S4 to 0 and 1 will be fine. So the second set of input stimulus can be the following:
10100 10
10101 01
10110 01

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for generating a set of test patterns for testing an electronic circuit having a plurality of circuit nodes comprising:
   generating said set of test patterns by applying a weighting factor based on a defect probability of a circuit malfunction including a malfunction of a short circuit and a leakage between adjacent nodes of said plurality of circuit nodes physically adjacent to each other.

2. A The method of claim 1 wherein:
   said step of generating said set of test patterns further comprising a step of setting said adjacent circuit nodes to opposite logic states.

3. A The method of claim 1 wherein:
   said step of generating said set of test patterns further comprising a step of setting said adjacent circuit nodes for storing bits of opposite logic states.

4. A The method of claim 1 wherein:
   said step of generating said set of test patterns further comprising a step of expending a set of test pattern by modifying a field of input stimulus or a sequence of input stimulus to set corresponding said adjacent circuit nodes to opposite logic states directly corresponding to the input stimulus.

5. A method of claim 1 wherein:
   Said step of generating said set of test patterns further comprising a step of expending a set of test pattern by modifying a field of input stimulus or a sequence of input stimulus to set corresponding said adjacent circuit nodes for storing bits of opposite logic states directly corresponding to the input stimulus.

6. A method for measuring a realistic manufacture process related test coverage, comprising:
   measuring tested nodes by applying a weighting factor based on a defect probability of a circuit malfunction including a malfunction of a short circuit and a leakage between two of said plurality of circuit nodes or groups of circuit nodes for defining fully tested nodes used in an actual manufacturing process.

7. A The method of claim 6 wherein:
   said step of measuring said tested nodes further comprising a step of applying a weighting factor based on a defect probability of a circuit malfunction including a malfunction of a short circuit and a leakage between two of said plurality of circuit nodes or groups of circuit nodes physically adjacent to each other.

8. A The method of claim 7 wherein:
   said step of measuring said test nodes further comprising a step of measuring said nodes by storing bits of opposite logic states in adjacent test nodes.

9. A The method of claim 6 wherein:
   said step of measuring said test nodes further comprising a step of measuring said nodes by storing bits of opposite logic states in adjacent test nodes.

10. A method of detecting short circuit between a plurality of circuit nodes inside an electronic circuit, comprising:
    detecting circuit malfunction including a malfunction of a short circuit and a leakage between two of said circuit nodes adjacent to each other circuit nodes by monitoring a current supplied to the electronic circuit during a circuit operation to detect a current increase due to the short circuit between said circuit nodes having different logic states.

11. A method of claim 10 wherein:

said step of detecting short circuit further comprising a step of dividing a voltage supply into multiple supply nets with current increase detection circuits and voltage regulation circuits for detecting the short circuit and also a defection location of said short circuit.

12. A method for generating a set of test patterns for testing an electronic circuit having a plurality of circuit nodes, comprising:

generating said set of test patterns by applying a weighting factor based on a defect probability of a circuit malfunction including a malfunction of a short circuit and a leakage between two or groups of said plurality of circuit nodes; and said step of generating said set of test patterns further comprising a step of expending a set of test patterns by modifying a field of input stimulus or a sequence of input stimulus to set corresponding said two or groups of nodes to opposite logic states directly corresponding to the input stimulus.

13. A The method of claim 12 wherein:

said step of generating said set of test patterns further comprising a step of expending a set of test pattern by modifying a field of input stimulus or a sequence of input stimulus to set corresponding said two or groups of nodes for storing bits of opposite logic states directly corresponding to the input stimulus.

* * * * *